United States Patent
Carter

(10) Patent No.: US 7,704,888 B2
(45) Date of Patent: Apr. 27, 2010

(54) METHODS FOR REMOVING PHOTORESIST FROM SEMICONDUCTOR STRUCTURES HAVING HIGH-K DIELECTRIC MATERIAL LAYERS

(75) Inventor: Richard J. Carter, Hopewell Junction, NY (US)

(73) Assignee: Globalfoundries Inc., Grand Caymen (KY)

( * ) Notice: Subject to any disclaimer, the term of this patent is extended or adjusted under 35 U.S.C. 154(b) by 552 days.

(21) Appl. No.: 11/626,360

(22) Filed: Jan. 23, 2007

(65) Prior Publication Data

US 2008/0176388 A1 Jul. 24, 2008

(51) Int. Cl.
*H01L 21/461* (2006.01)
*H01L 21/302* (2006.01)

(52) U.S. Cl. ............ 438/710; 438/725; 438/763; 438/780; 438/942; 438/947; 257/9; 257/414; 257/E21.252; 257/E21.253; 257/E21.256; 257/E21.461

(58) Field of Classification Search ............ 438/710, 438/725, 763, 780, 942, 947; 257/9, 414, 257/E21.252, E21.253, E21.256, E21.461
See application file for complete search history.

(56) References Cited

U.S. PATENT DOCUMENTS

| | | | | |
|---|---|---|---|---|
| 5,811,358 | A * | 9/1998 | Tseng et al. | 438/725 |
| 6,218,085 | B1 * | 4/2001 | Molloy et al. | 430/329 |
| 7,094,704 | B2 | 8/2006 | Jin et al. | |
| 7,115,530 | B2 | 10/2006 | Quevedo-Lopez et al. | |
| 2005/0199586 | A1 * | 9/2005 | Matsushita et al. | 216/67 |
| 2007/0254489 | A1 * | 11/2007 | Kawaguchi et al. | 438/727 |

OTHER PUBLICATIONS

I.L. Berry et al., Use of Plasma Assisted Sublimation to Remove Photoresist From Porous Low-k Dielectrics, SEMI Technical Symposium, 2004.
J.S. Montgomery et al., Morphology of Si(100) Surfaces Exposed to a Remote H Plasma, Appl. Phys. Lett. 67, Oct. 9, 1995, pp. 2194-2196.
R.J. Carter et al., In Situ Remote H-Plasma Cleaning of Patterned Si-SiO2 Surfaces, Journal of the Electrochemical Society, vol. 141, No. 11, Nov. 1994, pp. 3136-3140.
Hong Ying et al., Rie Passivation Layer Removal by Remote H-Plasma and H2/SiH4 Plasma Processing, Materials Research Society Conference Proceedings 1995.

* cited by examiner

*Primary Examiner*—Dao H Nguyen
(74) *Attorney, Agent, or Firm*—Ingrassia Fisher & Lorenz, P.C.

(57) ABSTRACT

Methods for removing photoresist from semiconductor structures are provided. In an exemplary embodiment, a method for removing photoresist from a semiconductor structure having a high-k dielectric material layer overlying a substrate comprises depositing a photoresist overlying the high-k dielectric material layer and patterning the photoresist. The temperature of the substrate is adjusted to a temperature of no less than about 400° C. and hydrogen gas is excited to form a hydrogen plasma of excited H and $H_2$ species. The photoresist is subjected to the excited H and $H_2$ species from the hydrogen plasma.

20 Claims, 3 Drawing Sheets

METHODS FOR REMOVING PHOTORESIST FROM SEMICONDUCTOR STRUCTURES HAVING HIGH-K DIELECTRIC MATERIAL LAYERS

FIELD OF THE INVENTION

The present invention generally relates to semiconductor fabrication, and more particularly relates to methods for removing photoresist from semiconductor structures having high-k dielectric material layers.

BACKGROUND OF THE INVENTION

Field effect transistors (FETs) are widely used in the electronics industry for a variety of applications related to both analog and digital electrical signals. One of the most common FETs is a metal-oxide-semiconductor field effect transistor (MOSFET). MOSFETs generally have a metal or polycrystalline silicon gate contact or electrode that is biased to create an electric field in an underlying channel between source and drain regions of a semiconductor substrate. The electric field inverts the channel and enables a current to flow between the source region and the drain region. A gate dielectric typically separates the channel region from the gate electrode. In prior art transistor structures, the gate dielectric is typically silicon dioxide ($SiO_2$).

However, as integrated circuit transistors have become smaller, the thickness of the dielectric materials in the gate structure has become thinner. Recent efforts directed to MOS device scaling accordingly have focused on dielectric materials having dielectric constants greater than that of $SiO_2$. As a result of higher physical gate dielectric thickness, these materials, commonly known as high-k dielectric materials, reduce gate current leakage compared to that of equivalent $SiO_2$ or nitrided $SiO_2$ while keeping the overall capacitance density to the required equivalent $SiO_2$ thickness.

Referring to FIG. 1, MOSFET gate structures 100 typically are formed by depositing a dielectric material 102 on a semiconductor substrate 104 and depositing gate electrode material 106 on the dielectric material. A photoresist 108 then is formed on the gate electrode material and is patterned by conventional photolithography. Once patterned, the photoresist serves as an etch mask during the etching of the gate electrode material 106 and, optionally, the dielectric material 102. Commercial photoresists are polymeric coatings that are designed to change properties upon exposure to light during a photolithography process. Then, either the exposed or unexposed regions of the coating can be selectively removed to reveal the substrate beneath.

After formation of the gate structure, the photoresist then is removed by an ashing process, which typically includes exposure to oxygen-based plasmas. However, oxygen-based plasmas often result in damage to high-k dielectric material-comprising gate structures. As illustrated in FIG. 2, an oxygen-based plasma process creates atomic oxygen, which can readily diffuse to the high-k dielectric material/substrate interface and the gate electrode/high-k dielectric material interface and form regrown silicon oxide 110. This diffused oxygen and regrown silicon oxide can severely degrade device characteristics and performance of the MOSFET.

Hydrogen-based plasma ("H-plasma") processes have been used to circumvent the damage caused by oxygen-based plasma processes. In H-plasma processes, the photoresist is exposed to H-plasma at temperatures at or below 350° C. Exposure of the gate electrode structure to the H-plasma results in a sputtering process whereby photoresist particles are physically "knocked" off the gate structure. However, as illustrated in FIG. 3, such physical sputtering also may result in "clipping" 114 of the exposed corners of the gate electrode 106, which degrades the gate electrode profile. In addition, prior art H-plasma processes can result in chemical etching 112 of silicon-containing materials, such as a silicon-containing substrate 104 and polycrystalline silicon-containing gate electrode 106, due to the generation of silane ($SiH_4$).

Accordingly, it is desirable to provide a method for removing photoresist from a semiconductor gate structure having a high-k dielectric material layer without substantial oxidation at the high-k dielectric material layer interfaces. In addition, it is desirable to provide a method for removing photoresist from a semiconductor structure while minimizing damage to the semiconductor structure. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for removing photoresist from a semiconductor structure having a high-k dielectric material layer overlying a substrate is provided. The method comprises depositing a photoresist overlying the high-k dielectric material layer and patterning the photoresist. The temperature of the substrate is adjusted to a temperature of no less than about 400° C. and hydrogen gas is excited to form a hydrogen plasma of excited H and $H_2$ species. The photoresist is subjected to the excited H and $H_2$ species from the hydrogen plasma.

In accordance with another exemplary embodiment, a method for fabricating a semiconductor structure overlying a substrate is provided. The method comprises the steps of depositing a high-k dielectric material layer overlying the substrate and depositing a gate electrode material on the high-k dielectric material layer. A patterned photoresist is formed on the gate electrode material and the gate electrode material is etched using the patterned photoresist as an etch mask. The temperature of the substrate is adjusted to a temperature of no less than about 400° C. and the patterned photoresist is removed using a remote hydrogen plasma process.

In accordance with a further exemplary embodiment, a method for minimizing damage to a silicon-containing substrate while removing a photoresist therefrom is provided. The method comprises the steps of forming a patterned photoresist overlying the silicon-containing substrate, heating the substrate to a temperature no less than about 400° C., and subjecting the photoresist to a remote hydrogen plasma process.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
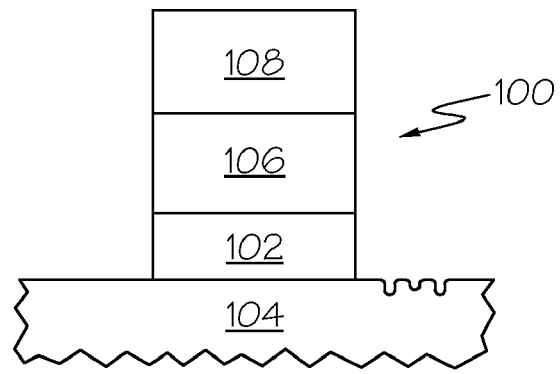
FIG. 1 is a cross-sectional view of a conventional MOSFET gate structure.
Figure 2:
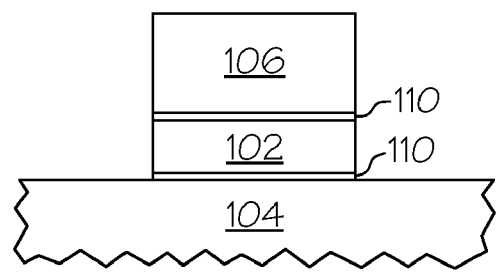
FIG. 2 is a cross-sectional view of the MOSFET gate structure of FIG. 1 after photoresist removal using an oxygen-based plasma process.
Figure 3:
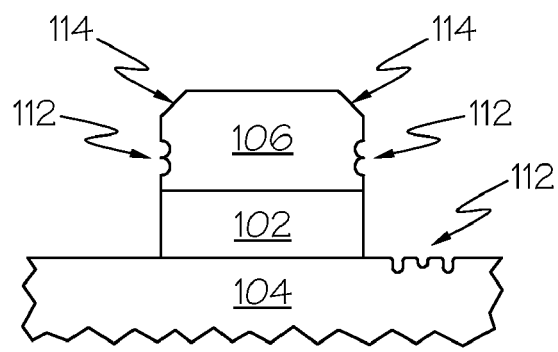
FIG. 3 is a cross-sectional view of the MOSFET gate structure of FIG. 1 after photoresist removal using a conventional hydrogen-based plasma process.
Figure 4:
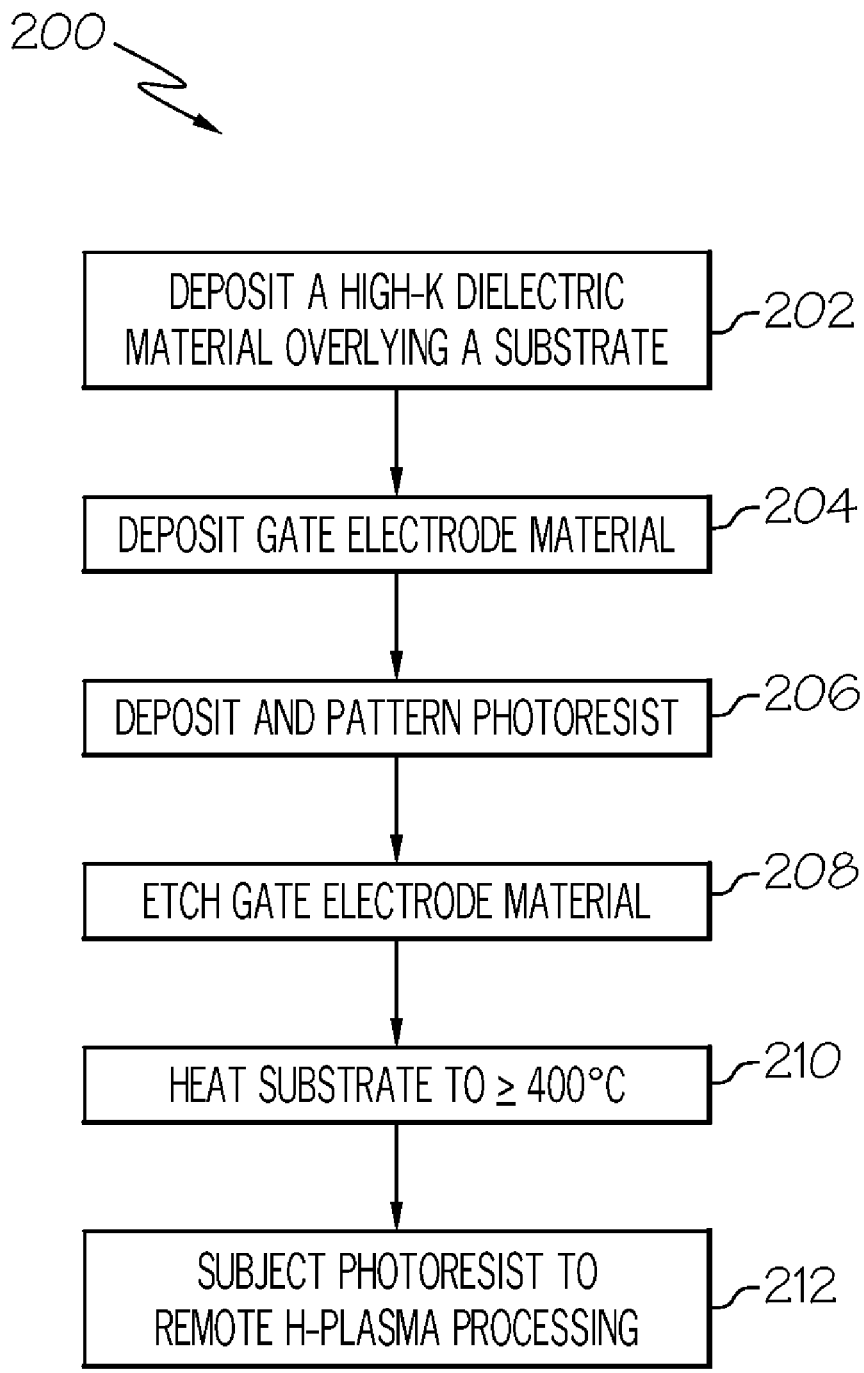
FIG. 4 is a flowchart of a method for forming a semiconductor structure, in accordance with an exemplary embodiment of the present invention.

In accordance with an exemplary embodiment of the present invention, a method 200 for forming a semiconductor structure, such as a gate electrode structure, overlying a substrate is illustrated in FIG. 4. The method begins by depositing a high-k dielectric material overlying a semiconductor substrate (step 202). The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The semiconductor substrate will hereinafter be referred to for convenience, but without limitation, as a silicon substrate. The silicon substrate may be a bulk silicon wafer, or may be a thin layer of silicon on an insulating layer (commonly know as silicon-on-insulator or SOI) that, in turn, is supported by a carrier wafer. The silicon substrate is impurity doped, for example by forming N-type well regions and P-type well regions for the fabrication of P-channel (PMOS) transistors and N-channel (NMOS) transistors.

The high-k dielectric material can be deposited in known manner by, for example, chemical vapor deposition (CVD), low pressure chemical vapor deposition (LPCVD), semi-atmospheric chemical vapor deposition (SACVD), or plasma enhanced chemical vapor deposition (PECVD). Examples of high-k dielectric materials that can be used to form the semiconductor structure include, but are not limited to, binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates; perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalite system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and a bi-layered perovskite system material such as strontium bismuth tantalate and bismuth titanate; and combinations thereof.

A layer of gate electrode material is deposited overlying the high-k dielectric material (step 204). The gate electrode material may be polycrystalline silicon or may comprise other electrically conductive gate electrode materials such as metals and metal silicides. The material may be formed by itself or with appropriate impurity doping that can set the necessary threshold voltage of the transistor. If the gate electrode material is polycrystalline silicon, that material is typically deposited by LPCVD by the hydrogen reduction of silane. The layer of polycrystalline silicon is preferably deposited as undoped polycrystalline silicon and is subsequently impurity doped by ion implantation. Although not illustrated, regions of electrically isolating material such as shallow trench isolation (STI) regions can be formed to extend into the semiconductor substrate to electrically isolate between transistors of the MOS circuit as required by the circuit function being implemented.

A photoresist then is formed overlying the gate electrode material and is patterned by conventional photolithography processing (step 206). The photoresist can be any photoresist polymer utilized in semiconductor technology and can be patterned using conventional lithography methods such as, for example, I-line or deep UV lithography.

After formation of the patterned photoresist and using the patterned photoresist as an etch mask, the gate electrode material is etched to form a gate electrode (step 208). In an exemplary embodiment, during or after the etch of the gate electrode material, the high-k dielectric material also may be etched. If the gate electrode material layer is formed of polycrystalline silicon, the polycrystalline silicon can be etched by, for example, reactive ion etching (RIE) using a $Cl^-$ or $HBr/O_2$ chemistry. The high-k dielectric material can be etched by, for example, a boron trichloride ($BCl_3$) chemistry.

Figure 5:
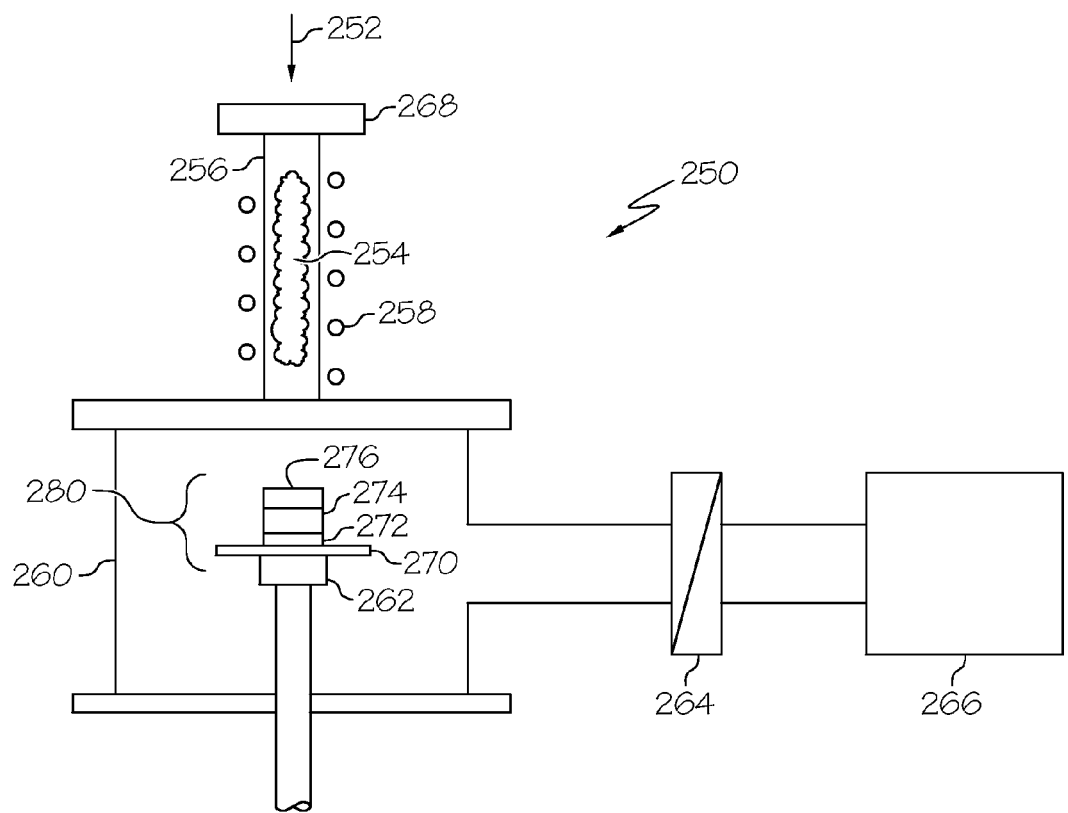
FIG. 5 is a cross-sectional view of a conventional chamber used for remote H-plasma processing.

Following the formation of the gate electrode, the photoresist is removed by heating the semiconductor substrate to a temperature no less than about 400° C. (step 210) and subjecting the photoresist to a remote H-plasma process (step 212). FIG. 5 is a simplified cross-sectional illustration of a conventional chamber 250 used for remote H-plasma exposure. However, it will be appreciated by those skilled in the art that other forms of remote H-plasma chambers may be used to practice the various embodiments of the present invention, including microwave plasma chambers, electron cyclotron resonance (ECR) plasma chambers, and the like. Hydrogen plasma 254 is created by direct excitation of molecular hydrogen gas, indicated by arrow 252, flowing through a quartz tube 256 with an inductive coil 258 encircling it. RF power is applied to the coil 258 creating atomic, ionized, and excited H and $H_2$ species. The plasma is essentially confined to the quartz tube. A semiconductor structure 280 having a substrate 270, a high-k dielectric material 272, a gate electrode 274, and photoresist 276, is located in a processing chamber 260 downstream from the center of the coil such that the semiconductor structure 280 is not exposed directly to the plasma. The processing chamber 260 includes a substrate support pedestal 262 and pressure within the processing chamber is controlled using a throttle valve 264 situated between the processing chamber 260 and a vacuum pump 266.

The semiconductor structure 280 is placed on the substrate support pedestal 262 and gas 252 is supplied to the quartz tube 256 through an entry port 268. The gas 252 comprises hydrogen and may further comprise other nonreactive gaseous components such nitrogen ($N_2$), helium (He), silane ($SiH_4$), and the like. In this regard, gas 252 comprises hydrogen in the range of greater than 0% and less than or equal to 100%.

During the H-plasma process, the semiconductor substrate 270 is heated by a resistive heater (not shown) within the pedestal 262 to a steady state temperature. The substrate 270 is heated or adjusted to and maintained at a temperature no less than about 400° C. In an exemplary embodiment, the temperature of the substrate 270 is heated or otherwise adjusted to and maintained at a temperature in the range of about 400° C. to about 500° C. The RF power supplied to the coil is sufficient to maintain a stable plasma within the quartz tube for the duration of the H-plasma process. In an exemplary embodiment, the RF power is in the range of about 10 Watts to about 2500 Watts. The gas 252 (or the components thereof) flow through entry port 268 at a rate sufficient to provide a substantially constant supply of hydrogen gas from which to form the plasma. In an exemplary embodiment, the flow rates of the components of gas 252 are in the range of about 5 standard cubic centimeters per minute (sccm) to about 500 sccm. Upon production of the plasma, atomic, ionized, and excited H and $H_2$ species flow from the plasma and interact with the photoresist 276 of the semiconductor structure 280. By conducting the remote H-plasma process at a temperature no less than 400° C., the photoresist is desorbed from the semiconductor structure as hydrocarbon particulates with minimal or no clipping of the gate electrode 274 and with minimal or no oxidation or silicon oxide regrowth at the high-k dielectric material 272 interfaces. In addition, etching of a silicon-containing substrate 270 and etching of a polycrystalline silicon gate electrode 274 is minimized or eliminated completely. While method 200 illustrated in FIG. 4 indicates that the step of heating or adjusting the temperature of the substrate to a temperature no less than about 400° C. (step 210) is commenced before the step of subjecting the photoresist to remote H-plasma processing (step 212) is commenced, it will be appreciated that the steps can be performed simultaneously or in the reverse order.

Accordingly, a method for removing photoresist from a semiconductor structure having a high-k dielectric material is provided. The method reduces or eliminates damage to a silicon-containing substrate and gate electrode of the semiconductor structure. In addition, the method reduces or eliminates oxidation or silicon oxide regrowth at the high-k dielectric material/substrate interface and at a high-k dielectric material/gate electrode interface. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for removing photoresist from a semiconductor gate structure having a high-k gate dielectric material layer overlying a substrate, the method comprising the steps of:
   depositing a photoresist overlying the high-k gate dielectric material layer and patterning the photoresist;
   adjusting the temperature of the substrate to a temperature of no less than about 400° C.;
   exciting hydrogen gas to form a hydrogen plasma of excited H and $H_2$ species; and
   subjecting the photoresist to the excited H and $H_2$ species from the hydrogen plasma.

2. The method of claim 1, wherein the step of adjusting the temperature of the substrate to the temperature no less than about 400° C. comprises the step of adjusting the temperature of the substrate to a temperature in the range of about 400° C. to about 500° C.

3. The method of claim 1, wherein the step of depositing the photoresist overlying the high-k gate dielectric material layer comprises the step of depositing a photoresist overlying layer comprising a material selected from the group consisting of binary metal oxides, metal oxynitrides, perovskite-type oxides, and combinations thereof.

4. The method of claim 1, further comprising the step of etching the high-k gate dielectric material layer after the steps of depositing and patterning the photoresist.

5. The method of claim 1, wherein the step of exciting hydrogen gas comprises the step of exciting gas having a hydrogen concentration in the range of greater than 0% and less than or equal to 100%.

6. The method of claim 5, wherein the step of exciting hydrogen gas comprises the step of exciting a gas including hydrogen and a material selected from the group consisting of helium, nitrogen, and silane.

7. The method of claim 1, wherein the step of subjecting is commenced before the step of adjusting is commenced.

8. The method of claim 1, wherein the step of adjusting and the step of subjecting are performed simultaneously.

9. The method of claim 1, wherein the step of subjecting the photoresist to the excited H and $H_2$ species from the hydrogen plasma comprises the step of disposing the photoresist downstream from the plasma.

10. The method of claim 1, further comprising the step of depositing a gate electrode material overlying the high-k gate dielectric material layer and wherein the step of depositing the photoresist overlying the high-k gate dielectric material layer comprises depositing the photoresist material overlying the gate electrode material.

11. A method for fabricating a semiconductor structure overlying a substrate, the method comprising the steps of:
    depositing a high-k dielectric material layer overlying the substrate;
    depositing a gate electrode material on the high-k dielectric material layer;
    forming a patterned photoresist on the gate electrode material;
    etching the gate electrode material using the patterned photoresist as an etch mask;
    adjusting and maintaining the temperature of the substrate to a temperature of no less than about 400° C.; and
    removing the patterned photoresist using a remote hydrogen plasma process while the temperature of the substrate is maintained at a temperature of no less than about 400° C.

12. The method of claim 11, wherein the step of depositing the high-K dielectric material layer overlying the substrate comprises the step of depositing overlying the substrate a material selected from the group consisting of binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), silicates thereof and aluminates thereof; metal oxynitrides including aluminum oxynitride (AlON), zirconium oxynitride (ZrON), hafnium oxynitride (HfON), lanthanum oxynitride (LaON), yttrium oxynitride (YON), silicates thereof and aluminates thereof; perovskite-type oxides including barium titanate, strontium titanate, barium strontium titanate (BST), lead titanate, lead zirconate titanate, lead lanthanum zirconate titanate, barium lanthanum titanate, barium zirconium titanate, lead magnesium niobate, lithium niobate, lithium tantalate, potassium niobate, strontium aluminum tantalite, potassium tantalum niobate, barium strontium niobate, lead barium niobate, barium titanium niobate, strontium bismuth tantalate, bismuth titanate, and combinations thereof.

13. The method of claim 11, wherein the step of depositing the high-k dielelectric material layer overlying the substrate comprises the step of depositing a high-k dielectric material layer overlying a silicon-containing substrate.

14. The method of claim 11, wherein the step of depositing the gate electrode material on the high-k dielectric material layer comprises the step of depositing polycrystalline silicon on the high-k dielectric material layer.

15. The method of claim 11, wherein the step of adjusting and maintaining the temperature of the substrate to the temperature no less than about 400° C. comprises the step of adjusting and maintaining the temperature of the substrate to a temperature in the range of about 400° C. to about 500° C.

16. The method of claim 11, wherein the step of etching the gate electrode material using the patterned photoresist as an etch mask comprises the step of etching the high-k dielectric material layer using the patterned photoresist as an etch mask.

17. The method of claim 11, wherein the step of removing the patterned photoresist using the remote hydrogen plasma process comprises the steps of exciting hydrogen gas to form a hydrogen plasma of excited H and $H_2$ species and subjecting the photoresist to the excited H and $H_2$ species from the hydrogen plasma.

18. A method for minimizing damage to a silicon-containing substrate having a high-K dielectric material layer while removing a photoresist therefrom, the method comprising the steps of:
    forming a patterned photoresist overlying the silicon-containing substrate having the high-K dielectric material layer;
    heating the substrate to a temperature no less than about 400° C.; and
    subjecting the photoresist to a remote hydrogen plasma process while maintaining the temperature of no less than about 400° C.

19. The method of claim 18, further comprising the step of depositing the high-k dielectric material layer overlying the silicon-containing substrate, wherein the step of depositing the high-k dielectric material layer is performed before the step of forming the patterned photoresist.

20. The method of claim 18, wherein the step of heating the substrate to the temperature no less than about 400° C. comprises the step of heating the substrate to a temperature in the range of about 400° C. to 500° C.

* * * * *